(12) United States Patent
Divakaruni et al.

(10) Patent No.: US 6,750,097 B2
(45) Date of Patent: Jun. 15, 2004

(54) METHOD OF FABRICATING A PATTERENED SOI EMBEDDED DRAM/EDRAM HAVING A VERTICAL DEVICE CELL AND DEVICE FORMED THEREBY

(75) Inventors: Ramachandra Divakaruni, Ossining, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/210,632

(22) Filed: Jul. 30, 2002

(65) Prior Publication Data

US 2004/0023473 A1 Feb. 5, 2004

(51) Int. Cl.⁷ .......................................... H01L 21/8242
(52) U.S. Cl. ...................................................... 438/243
(58) Field of Search ................................ 438/243, 248, 438/386, 391

(56) References Cited

U.S. PATENT DOCUMENTS

| | | | |
|---|---|---|---|
| 6,121,651 A | 9/2000 | Furukawa et al. | 257/296 |
| 6,258,659 B1 | 7/2001 | Gruening et al. | 438/243 |
| 6,323,082 B1 | 11/2001 | Furukawa et al. | 438/247 |
| 6,335,248 B1 | 1/2002 | Mandelman et al. | 438/279 |
| 6,350,653 B1 | 2/2002 | Adkisson et al. | 438/258 |
| 6,391,703 B1 | 5/2002 | Rovedo et al. | 438/271 |
| 6,391,706 B2 * | 5/2002 | Wu et al. | 438/243 |
| 6,410,399 B1 | 6/2002 | Flaitz et al. | 438/387 |
| 6,429,068 B1 | 8/2002 | Divakaruni et al. | 438/243 |
| 6,553,561 B2 | 4/2003 | Bard et al. | 716/17 |
| 2003/0003651 A1 | 1/2003 | Divakaruni et al. | 438/243 |

* cited by examiner

Primary Examiner—David Nelms
Assistant Examiner—Quoc Hoang (57) ABSTRACT

Disclosed herein is a patterned silicon-on-insulator (SOI) method of fabricating a combined integrated circuit having both a logic portion and an embedded dynamic random access memory (DRAM) array portion. The disclosed method includes masking an array portion of a substrate with a first mask, implanting oxygen to form a buried oxide layer in a logic portion of the substrate not masked by the first mask, depositing and patterning a second mask over the array portion and the logic portion, and etching isolation trenches in the array portion and the logic portion, the isolation trenches defined by openings in the patterned second mask. The first mask may additionally protect the array portion when rounding device corners in the logic portion. The second mask may additionally protect the logic portion when performing implants in the array portion. An integrated circuit formed on a single substrate is disclosed herein including at least one SOI device having a rounded corner and at least one DRAM cell having a vertical pass gate, wherein the DRAM cell is formed on a bulk portion of the substrate.

19 Claims, 8 Drawing Sheets

METHOD OF FABRICATING A PATTERENED SOI EMBEDDED DRAM/EDRAM HAVING A VERTICAL DEVICE CELL AND DEVICE FORMED THEREBY

FIELD OF THE INVENTION

The present invention relates to semiconductor processing, and more specifically to a method of performing combined fabrication of logic and dynamic random access memory (DRAM) on the same integrated circuit.

BACKGROUND OF THE INVENTION

Conventional processes for fabricating integrated circuits having DRAM or embedded DRAM (hereinafter, eDRAM) devices therein, employ a pad silicon nitride layer (hereinafter, "pad nitride") as a masking and polish stop layer when forming trench isolations between active devices. Using the pad nitride in such manner, shallow trench isolations (STIs) are formed in at least the supports (the logic portion of the IC) and deeper ITs (isolation trenches) may be formed for isolating vertical devices from each other in the DRAM array.

In the supports, where the active devices are "planar" (i.e., oriented parallel to the plane of the substrate, as opposed to perpendicular, i.e. "vertical"), it is undesirable for the device channel to have a sharp corner. A device corner is a location just below the gate dielectric where the device channel adjoins an isolation. At the device corner, the threshold voltage ($V_T$) of the device is lowered locally due to a corner parasitic device, such that even when the device is biased at a voltage below VT, an appreciable amount of current ($I_{OFF}$) flows through the device channel. However, when the device is turned at a voltage above $V_T$, there is no meaningful increase in $I_{ON}$, the on-current. Although it is known that the corner parasitic current can be suppressed by making the device corner less sharp; i.e. increasing its radius of curvature, achieving such result is difficult.

Sufficient corner rounding does not occur merely because a pad nitride and a thin pad silicon oxide (hereinafter referred to as "thin pad oxide") are employed during processing, as conventionally practiced. Although some oxygen is able to diffuse through the thin pad oxide during AA oxidation (oxidation of the active areas), it does not provide sufficient AA corner rounding.

Thus, special processing must be employed for rounding the device corners of the logic devices in combined logic and DRAM chips. However, such processing is difficult and costly to integrate with presently practiced DRAM processing. For example, the device corner can be rounded by pulling back the pad nitride layer prior to active area oxidation and/or sacrificial oxidation. As practiced, pad nitride pullback is performed by isotropically etching the exposed edges of the pad nitride where they overlay the active areas in the supports. Once the corners of the active area are thus exposed, rounding can be achieved by oxidation and/or etching methods.

However, pad nitride pullback is not very desirable for use in corner rounding. During the pad nitride pullback, the DRAM array portions must be protectively masked to prevent deleterious effects, such as undercut of the trench top oxide (TTO) in the vertical device array. Thus, such corner rounding process entails costs for applying and clearing the block mask in the array. In addition, the pad nitride pullback reduces the effective width of the already narrow width array transfer device, thereby lowering the drive current of that critical device of the array.

In DRAM and chips having an embedded DRAM, it is also necessary to form bitline diffusion implants, usually via N+XA dopant implants in the array areas. Typically, in combined logic and DRAM chips, separate protective masking of the supports has been required to perform such implants in the DRAM array.

SUMMARY OF THE INVENTION

According to an aspect of the invention, a patterned silicon-on-insulator substrate method is provided of fabricating a combined integrated circuit having both a logic portion and an embedded dynamic random access memory array portion. Such method includes masking an array portion of a substrate with a first mask; implanting oxygen to form a buried oxide layer in a logic portion of the substrate not masked by the first mask; depositing and patterning a second mask over the array portion and the logic portion; and etching isolation trenches in the array portion and the logic portion, the isolation trenches defined by openings in the patterned second mask.

According to a preferred aspect of the invention, the first mask, which remains in the array portion after protecting it during the oxygen implants elsewhere, may be reused to protectively mask the array portion when rounding the device corners of the logic portion of the substrate.

According to another aspect of the invention, an integrated circuit formed on a single substrate includes at least one silicon-on-insulator (SOI) device having a rounded corner and at least one dynamic random access memory (DRAM) cell having a vertical pass gate, wherein the DRAM cell is formed on a bulk portion of the substrate.

According to another preferred aspect of the invention, a mask remaining from a corner rounding process in the logic portion of the substrate may be used to protectively mask the logic portion when performing surface implants to the array portion of the substrate.

DETAILED DESCRIPTION OF THE PREFERRED EMBODIMENTS

The process described herein is specifically applied to the fabrication of an integrated circuit having a logic portion formed in a silicon-on-insulator (SOI) region of the substrate, and an array portion formed in a bulk silicon region of the substrate. To increase logic performance, it is desirable to fabricate CMOS devices in the logic portion in SOI regions. Conversely, it is desirable to fabricate the array portion in bulk substrate regions, because there is as yet no satisfactory way of handling the expected floating body effects of array devices in SOI, which floating body effects might cause dynamic loss of stored data. Moreover, body contacts to devices in the array are undesirable, as they add complexity to the fabrication process and consume valuable silicon real estate. In addition, in order to meet the ultra-low leakage current requirements for DRAMs, it is desired to form the array MOSFETs in a bulk substrate of the highest single crystal silicon quality because defects in the crystal structure caused by the buried oxide implantation lead to higher leakage currents. Thus, a combined logic and DRAM chip is formed by a patterned SOI process in which an array portion of the substrate preserved as bulk silicon by protectively masking the array portion, and the logic portion is made into SOI by implanting oxygen under the surface of the logic portion to form a buried oxide layer.

Thus, the protective mask of the array used during the oxygen implant is reused to advantage in the herein described process to avoid requiring additional masks for AA corner rounding and/or bitline diffusion implants.

Figure 1:
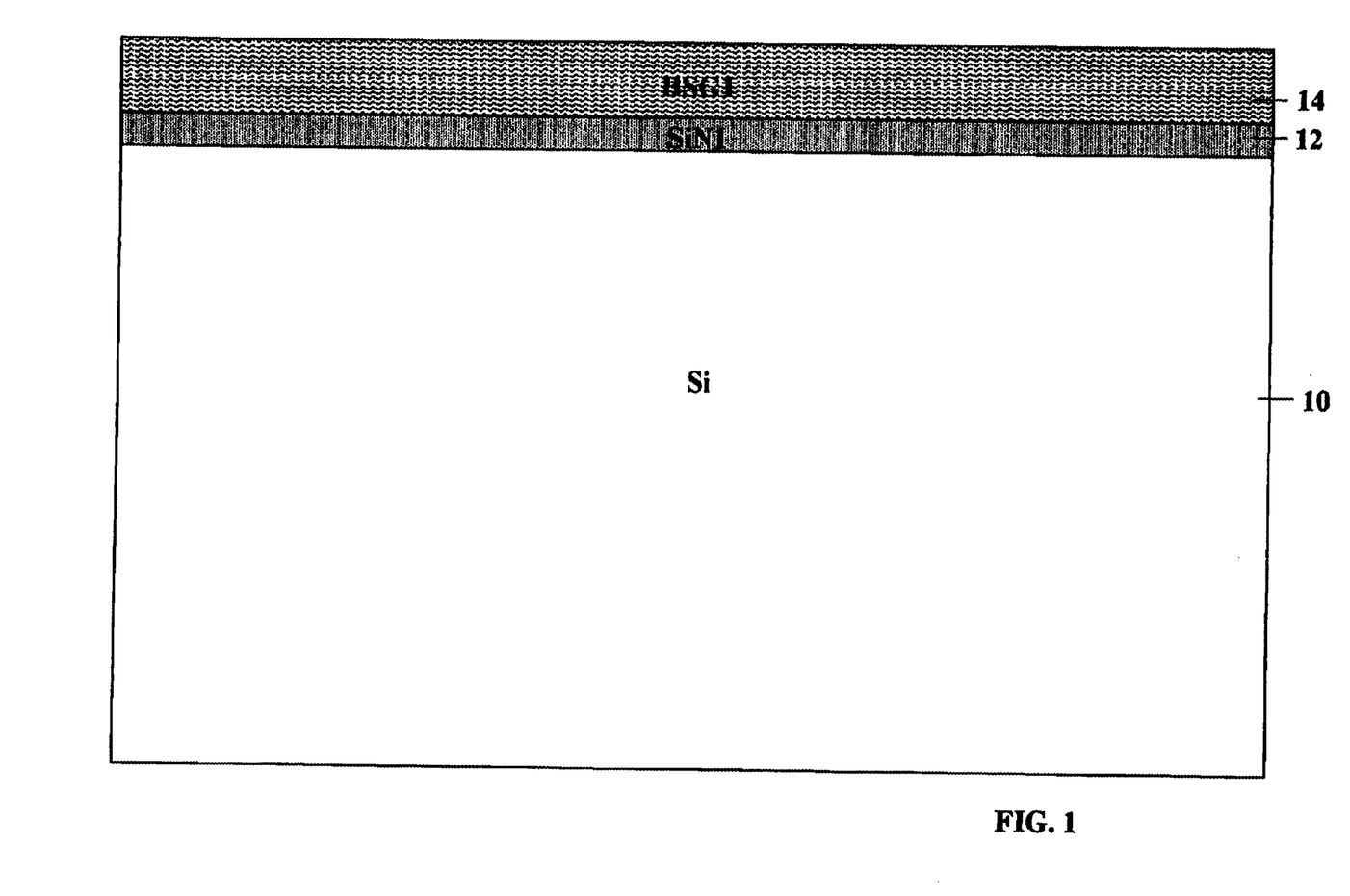
FIGS. 1 to 8 illustrate steps in the fabrication of a combined integrated circuit having an embedded DRAM formed in a bulk substrate region and logic formed in a patterned SOI region of a substrate.

The key process steps associated with this invention are described with reference to the Figures as follows:

As illustrated in FIG. 1, starting with a standard bulk silicon wafer 10, a first pad nitride layer 12 (i.e. pad silicon oxide) is deposited. Then a first hard mask BSG1 layer 14 of borosilicate glass (BSG) is deposited over the first pad nitride layer 12 (SiN1). A pad oxide layer 11 (i.e. pad silicon oxide) may be optionally formed on the silicon substrate 10, preferably by thermal oxidation, prior to the deposition of the SiN1 pad nitride layer 12. Note that the thickness of the first pad nitride layer 12 (SiN1 12) determines the thickness of a silicon oxide mask layer 20 (FIG. 3) which is deposited, preferably by a high density plasma (HDP) process which is then planarized to the first pad nitride layer 12. This silicon oxide mask layer 20 will be used as a self-aligned mask to block array implants from the supports. Thus, the thickness of the first pad nitride 12 is selected appropriately.

Figure 2:
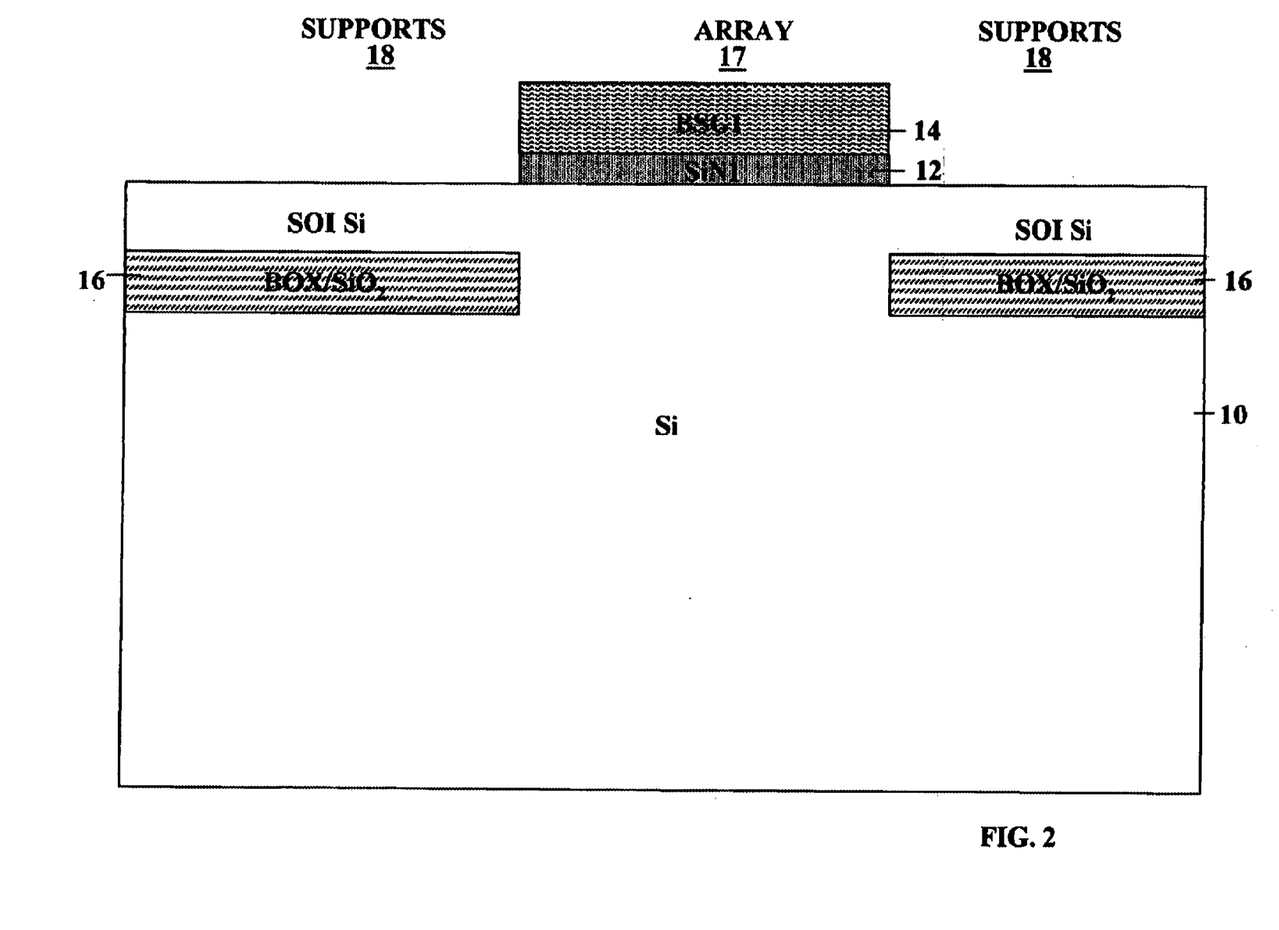

Referring to FIG. 2, the SiN1 pad nitride layer 12 and the first hard mask BSG1 layer 14 are patterned such that the substrate 10 is exposed only in the supports areas 18 which will contain the high performance SOI CMOS (Complementary Metal Oxide Semiconductor) logic, while the array areas 17 remain protected. It is to be noted that if some logic devices, as well as the DRAM array are to be formed in bulk substrate areas, such areas will be protected by the block mask as well. Next, as is customary in patterned SOI, one or more high dose oxygen implants (SIMOX) are performed, followed by a long high temperature anneal (~1300 C. for >12 hrs in an argon/oxygen ambient). This operation forms the buried oxide (also known as back oxide, or "BOX") 16 of the silicon-on-insulator regions in the supports 18. The first hard mask BSG layer 14 is then stripped by conventional methods.

Figure 3:
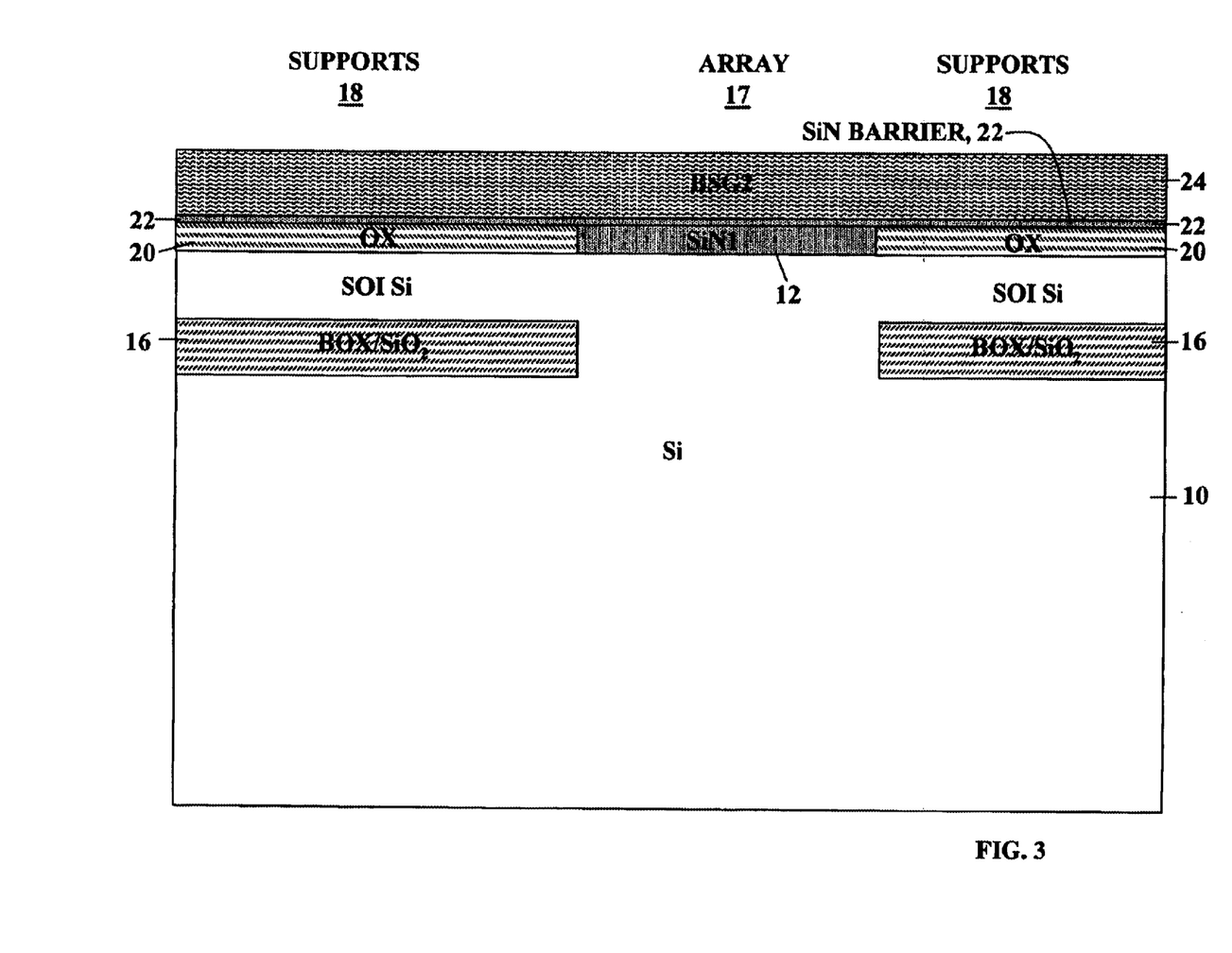

Then, as illustrated in FIG. 3, the HDP silicon oxide mask layer 20 is deposited and planarized to the top surface of the first pad nitride layer 12. A thin CVD SiN barrier 22 is then optionally deposited, which will serve as an etch stop layer during a subsequent step. Next, a second hard mask (BSG2) layer 24 is deposited. The second hard mask BSG2 layer 24 is used for masking during subsequent etching of deep trenches in the array 17.

Figure 4:
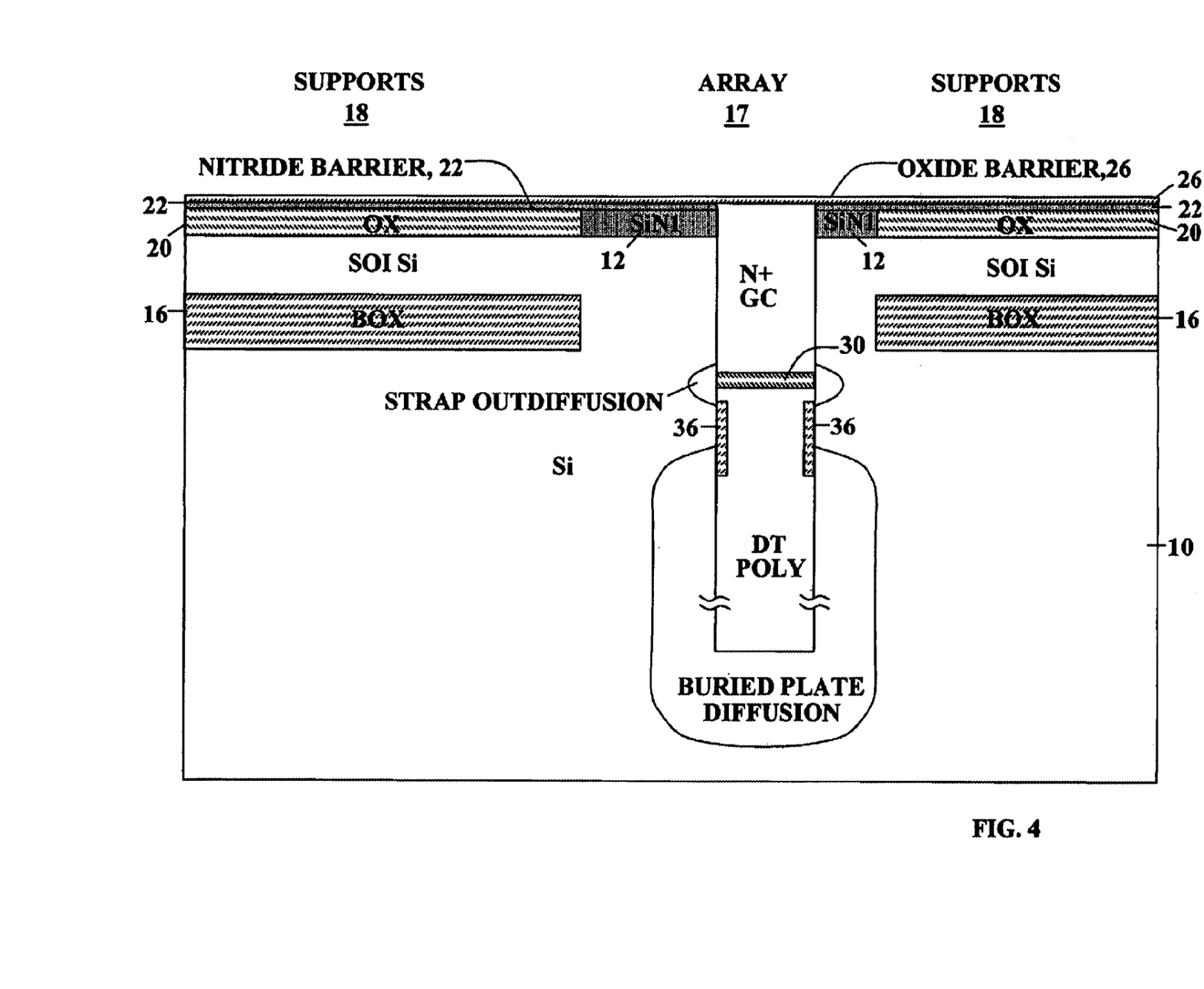

Referring to FIG. 4, following customary processing, deep trenches for fabricating DRAM cells are etched in the array areas 17 using BSG2 layer 24 as the hardmask. During the deep trench etch process, most of the BSG2 layer 24 is consumed. Any BSG material remaining thereafter is later removed after the deep trench etch. Storage capacitors and vertical MOSFETs are formed in the deep trenches. The formation of the storage capacitors involves well known processes such as isolation collar formation, buried-plate outdiffusion, node dielectric, and N+ doped poly fill, planarization and recess.

An insulating layer 30 (preferably of oxide deposited by high density plasma, HDP) is formed over the recessed polysilicon in the deep trench as a trench top oxide (TTO), to insulate the storage capacitor polysilicon from the vertical gate conductor. Gate oxidation, deposition and planarization of the gate conductor poly of the vertical array MOSFET follows. The gate poly planarization process removes remaining oxide from the top surface and stops on the nitride barrier 22. An optional silicon oxide barrier 26 is deposited, preferably by CVD.

Figure 5:
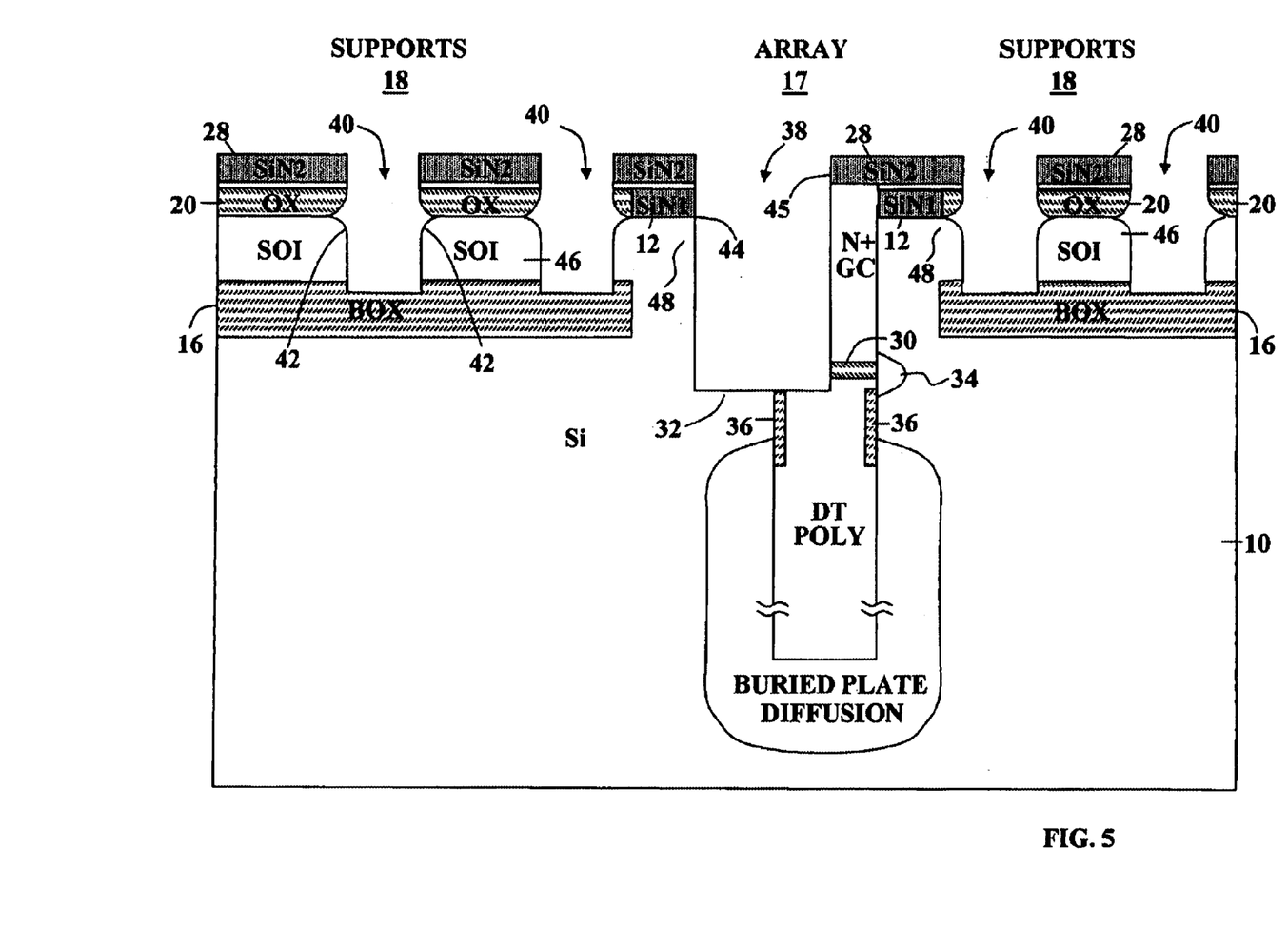

Then, as illustrated in FIG. 5, a second pad nitride layer 28 (SiN2) is deposited. This second pad silicon nitride layer 28, together with any optional overlying hard mask layer (e.g. BSG) serves as a mask when etching isolation trenches 38,40 in the array 17 and the supports 18. The pad nitride layer 28 is then patterned, together with any optional overlying hard mask and together with the first pad nitride layer 12 in the array 17 and the silicon oxide mask layer 20 in the supports 18, and the structures thereunder are then directionally etched (e.g. by a reactive ion etch, RIE) to define the active areas (AA) and the isolation regions in the array 17 and supports 18. The silicon RIE stops in the support areas 18 when the back oxide (BOX) 16 is reached, but continues in the array 17 until the trench top oxide 30 is reached. The etch chemistry is then switched to remove the exposed portion of the trench top oxide 30. Then the silicon etch is resumed to etch to a depth 32 which is deeper than the buried strap outdiffusion 34, and the exposed collar oxide 36 is removed with a short oxide etch. As shown in FIG. 5, a portion of the back oxide (BOX) 16 is also removed during the etching of the trench top oxide 30 and collar oxide 36.

Once the isolation trenches 38, 40 are etched, the AA silicon corners 42 in the supports 18 may be rounded. Undercut of the edges of the silicon oxide mask layer 20 in the support regions 18 occurs as a natural consequence of the AA ox preclean operation. Since there is no silicon oxide mask layer 20 in the array regions 17, minimal undercut occurs. Thus the AA edges 42 in the supports 18 are exposed, while the AA edges 44 and the vertical gate edges 45 in the array 17 remain protected by the first pad nitride layer 12 and the second pad nitride layers (SiN1 12 and SiN2 28).

Corner rounding of the support AA edges 42 is achieved predominantly by oxidation. The exposed corners 42 in the supports may optionally be rounded by an isotropic silicon etch, while the array corners 44 remain protected by the first pad nitride layer 12. During AA oxide liner growth, corner rounding in the supports 18 is further enhanced, since oxygen readily diffuses through the silicon oxide mask layer 20 overlying the active area (AA) silicon 46 in the supports 18 while oxygen diffusion into the AA edge is inhibited in the array 17 by the first pad nitride layer 12. In the array regions 17, the surface of the silicon 48 is protected by the first pad nitride layer 12; thus, corner oxidation in the array is negligible.

Figure 6:
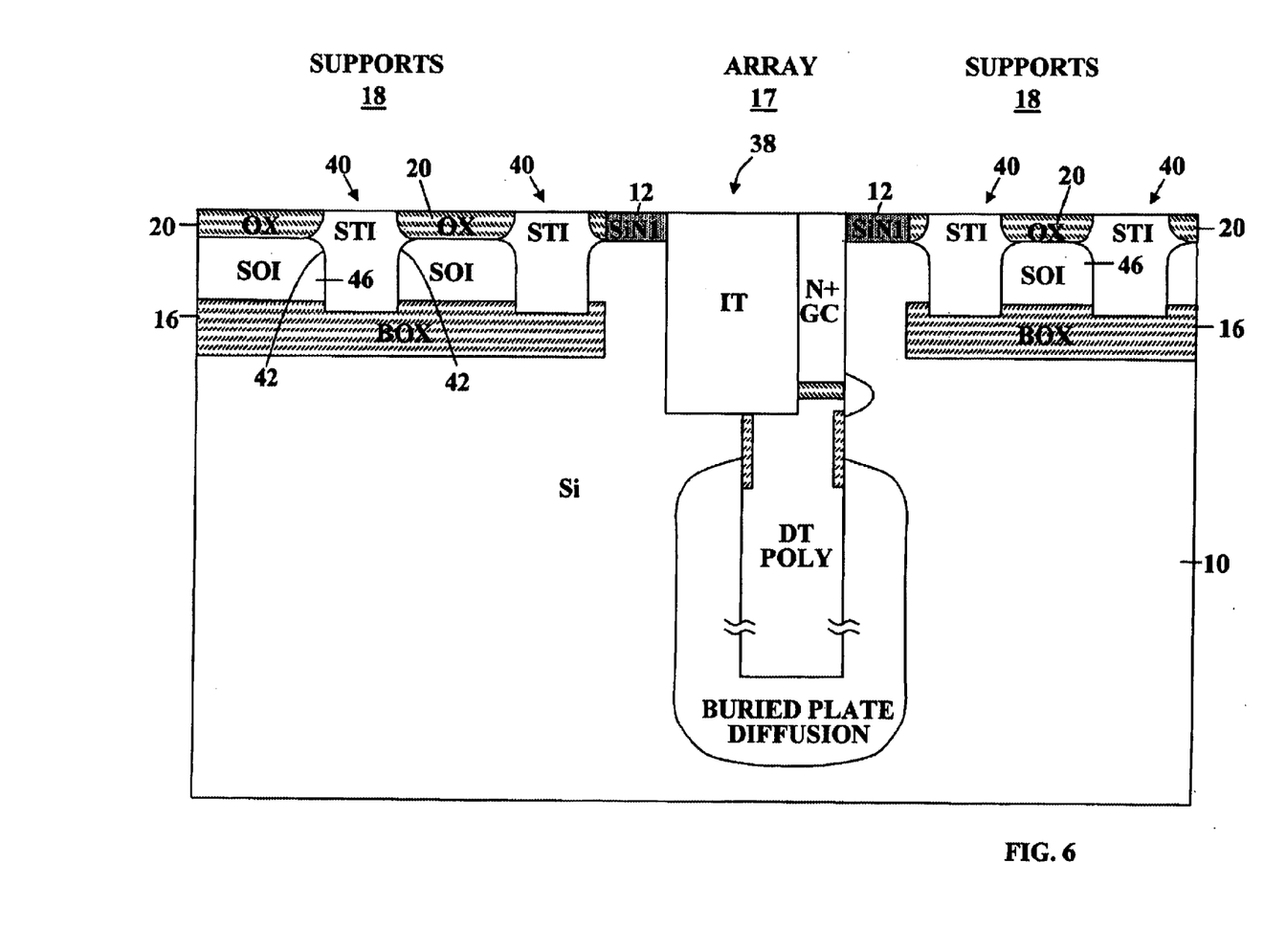

Referring to FIG. 6, once the corners 42 are rounded, an AA nitride liner (not shown) is deposited, and the isolation trenches 38, 40 are filled with silicon oxide (preferably by HDP silicon oxide deposition) and then planarized to the top surface of the second pad nitride layer 28.

Figure 7:
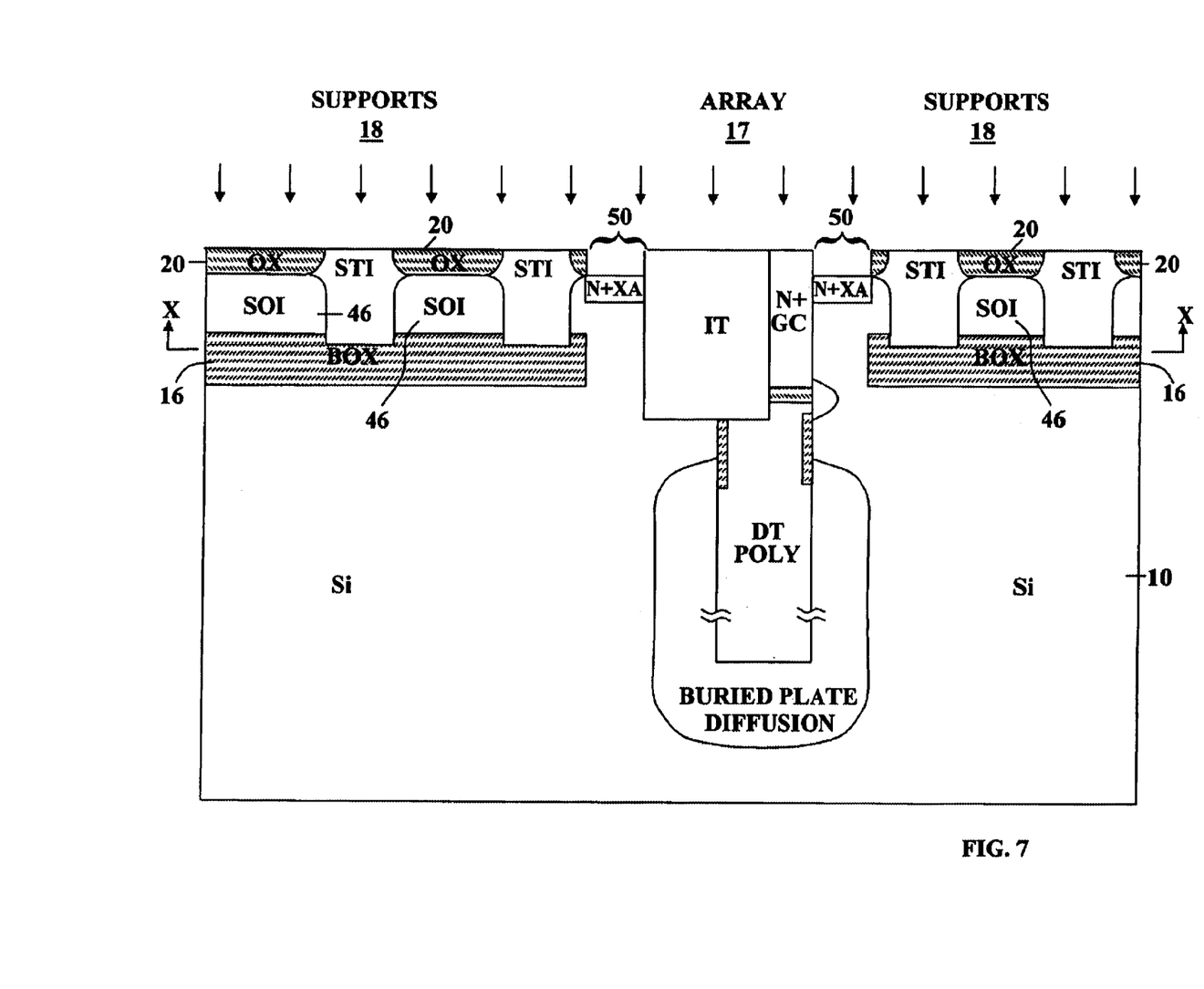
Figure 8:
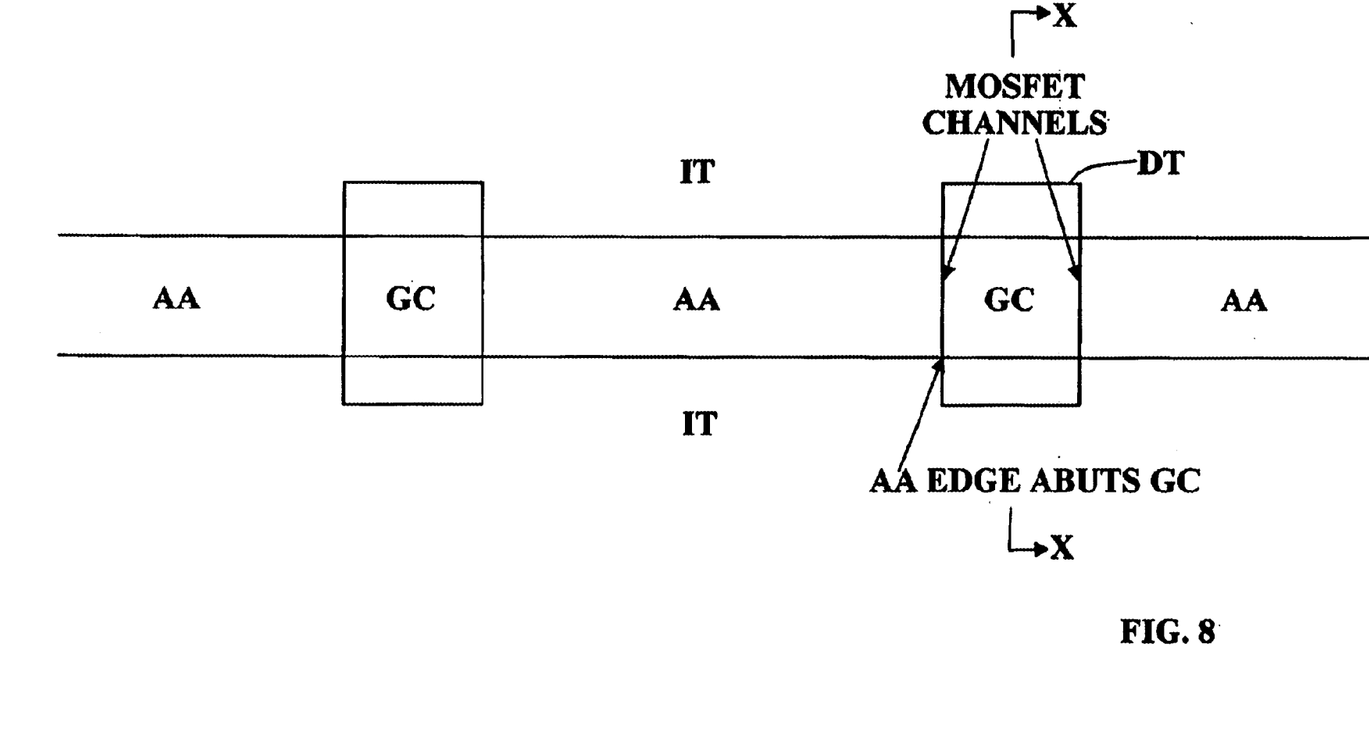

Then, as illustrated in FIG. 7, the remaining portion of the pad nitride (including first pad nitride layer 12 and second pad nitride layer 28) is removed selective to silicon oxide and silicon. Since none of the first pad nitride layer 12 was present in the support regions 18, the silicon substrate 46 of the support regions 18 remains protected from subsequent implants by the silicon oxide layer 20. The open windows 50 in the array 17 can now receive both certain portions of the array P-well (depending on the thickness of the prior first pad nitride layer 12) and N+XA implants.

It will be understood that no additional mask has been required to define the implant pattern in the array 17. The openings 50 in the array 17 which will receive the implants had been defined much earlier in the process by the mask provided by the first pad nitride layer 12 and the first hard mask BSG layer 14 used to define areas that received the SIMOX implant used to form the buried oxide layer 16. The implants are performed after growing a sacrificial oxide on the array active areas 48 in windows 50. Portions of the array wells and N+XA bitline diffusions are implanted through windows 50. Silicon oxide (not shown) is then deposited in openings 50, preferably by high density plasma (HDP), and then planarized. After applying a block mask to protect array areas 17, the silicon oxide layer 20 in the support areas 18 is then removed, a sacrificial oxide grown, and implants performed in the support areas 18. Thereafter, processing of the integrated circuit proceeds to completion according to known processes.

While the invention has been described herein in accordance with certain preferred embodiments thereof, those skilled in the art will recognize the many modifications and enhancements which can be made without departing from the true scope and spirit of the present invention, limited only by the claims appended below.

What is claimed is:

1. A patterned silicon-on-insulator substrate method of fabricating a combined integrated circuit having both a logic portion and an embedded dynamic random access memory (DRAM) array portion, comprising:
    masking said DRAM array portion of a substrate with a first hard mask;
    implanting oxygen to form a buried oxide layer in said logic portion of said substrate not masked by said first mask;
    depositing and patterning a second hard mask over said DRAM array portion and said logic portion;
    etching isolation trenches in said DRAM array portion and said logic portion, said isolation trenches being defined by openings in said patterned second mask, and
    rounding corners in said substrate exposed by said etching of said isolation trenches in said logic portion.

2. The method of claim 1 further comprising filling said isolation trenches with a material including a dielectric to form isolations in said substrate.

3. The method of claim 1 wherein said isolation trenches are etched in said logic portion to a first depth coinciding with said buried oxide layer, and are etched in said DRAM array portion to a greater, second depth for isolating vertically oriented devices in said DRAM.

4. The method of claim 1 wherein said first mask comprises a nitride.

5. An integrated circuit formed by the method of claim 1.

6. The integrated circuit according to claim 5, said logic portion of said integrated circuit further including device corners rounded by a process of partially etching back an oxide layer covering single-crystal surfaces of said substrate, oxidizing said single-crystal surfaces, and thereafter removing a surface oxide therefrom.

7. The integrated circuit according to claim 5 wherein said array portion of said integrated circuit is implanted with dopants after filling said isolation trenches in said array portion and said logic portion through openings in said oxide layer and said first mask, said array portion being exposed by removing said first mask.

8. A patterned silicon-on-insulator substrate method of fabricating a combined integrated circuit having both a logic portion and an embedded dynamic random access memory (DRAM) array portion, comprising:
    masking said DRAM array portion of a substrate with a first mask;
    implanting oxygen to form a buried oxide layer in said logic portion of said substrate not masked by said first mask;
    depositing and patterning a second mask over said DRAM array portion and said logic portions;
    etching isolation trenches in said DRAM array portion and said logic portion, said isolation trenches being defined by openings in said patterned second mask,
    prior to depositing and patterning said second mask:
        depositing over said logic portion a third mask comprising a oxide,
        patterning said third mask with openings etched in said second mask,
        thereafter laterally etching back openings in said third mask selective to a material of said second mask, and
        rounding corners of devices exposed in said etched back openings.

9. The method of claim 8 wherein said device corners are rounded by a process including oxidizing exposed surfaces of said substrate including surfaces exposed by etching back said third mask, and thereafter removing a surface oxide.

10. The method of claim 8 further comprising filling said isolation trenches with a material including a dielectric to form isolations in said substrate.

11. The method of claim 10, further comprising removing said first mask but not said third mask, and thereafter doping exposed portions of said substrate including said DRAM array portion.

12. The method of claim 11 wherein devices of said logic portion are masked by said third mask during said doping.

13. The method of claim 11 wherein said doping is performed by ion implantation.

14. A patterned silicon-on-insulator substrate method of fabricating a combined integrated circuit having a logic portion and an embedded dynamic random access memory (eDRAM) portion, comprising:
    masking an eDRAM array portion of a single-crystal substrate with a first deposited nitride layer;
    implanting oxygen to form a buried oxide layer in a logic portion of said substrate not masked by said first deposited nitride layer;
    depositing an oxide layer over said logic portion;
    depositing a patterning a second nitride layer over said array portion and said logic portion;
    patterning said oxide layer with said patterned second nitride layer;
    etching isolation trenches in said array portion and said logic portion, said isolation trenches being defined by openings in said patterned second nitride layer and said oxide layer;
    thereafter laterally etching back said oxide layer selective to nitride; and
    rounding device corners of said single-crystal substrate exposed by said etching back of said oxide layer.

15. The method of claim 14 wherein said device corners are further rounded by a process including oxidizing portions of said single-crystal substrate exposed by said etching back, and thereafter removing a surface oxide.

16. The method of claim 15 further comprising filling said isolation trenches with a deposited oxide.

17. The method of claim 16 further comprising removing said first deposited nitride layer but not said oxide layer, and thereafter doping exposed portions of said substrate including said array portion.

18. The method of claim 17 wherein devices of said logic portion are masked during said doping by said oxide layer.

19. The method of claim 17 wherein said doping is performed by ion implantation.

* * * * *